United States Patent
Park et al.

(10) Patent No.: US 9,019,784 B2
(45) Date of Patent: Apr. 28, 2015

(54) DATA TRAINING DEVICE

(71) Applicant: SK hynix Inc., Incheon-si Gyeonggi-do (KR)

(72) Inventors: Sang Il Park, Suwon-si (KR); Joo Hwan Cho, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/100,684

(22) Filed: Dec. 9, 2013

(65) Prior Publication Data

US 2015/0071014 A1    Mar. 12, 2015

(30) Foreign Application Priority Data

Sep. 10, 2013   (KR) .................. 10-2013-0108444

(51) Int. Cl.
   *G11C 7/00*   (2006.01)
   *G11C 7/12*   (2006.01)
(52) U.S. Cl.
   CPC ........................................ *G11C 7/12* (2013.01)
(58) Field of Classification Search
   CPC ........ G11C 11/4091; G11C 7/06; G11C 7/12; G11C 2207/065; G11C 11/4094; G11C 7/1078; G11C 16/24
   USPC ........ 365/189.16–189.17, 205, 203, 189.011, 365/189.07
   See application file for complete search history.

(56) References Cited

U.S. PATENT DOCUMENTS 7,266,030 B2 *    9/2007   Do et al. .................. 365/207
7,843,725 B2 *   11/2010   Sarin et al. ............... 365/185.03
8,374,043 B2 *    2/2013   Lee et al. .................. 365/207

FOREIGN PATENT DOCUMENTS

KR    1020090070561 A    7/2009

* cited by examiner

*Primary Examiner* — David Lam
(74) *Attorney, Agent, or Firm* — William Park & Associates Ltd.

(57) ABSTRACT

A data training device includes a training control block configured to activate driving signals for driving a bit line sense amplifier, with a word line deactivated, when a write training operation is performed according to a mode register write command; and the bit line sense amplifier configured to store training data according to the driving signals from the training control block.

19 Claims, 6 Drawing Sheets

DATA TRAINING DEVICE

CROSS-REFERENCES TO RELATED APPLICATION

The present application claims priority under 35 U.S.C. §119(a) to Korean application number 10-2013-108444, filed on Sep. 10, 2013, in the Korean Intellectual Property Office, which is incorporated herein by reference in its entirety.

BACKGROUND

1. Technical Field

Various embodiments generally relate to a data training device, and more particularly, to a technology for improving the precision of write training by using a bit line sense amplifier.

2. Related Art

A semiconductor memory device has continuously been developed to increase the degree of integration and elevate an operation speed. In order to elevate an operation speed, a so-called synchronous type semiconductor memory device which is capable of operating in synchronization with a clock provided from an outside of a memory chip has been disclosed.

A DDR (double data rate) synchronous type memory device adopts a scheme of processing two pieces of data (i.e, 1 bit per piece of data or more) during one clock cycle. In each data input/output pin of a DDR synchronous type memory device, two pieces of data are consecutively inputted and outputted in synchronization with the rising edge and the falling edge of a clock which is inputted from an outside. Accordingly, since it is possible to achieve a bandwidth at least two times broader than a conventional SDR synchronous type memory device without increasing the frequency of a clock, a high speed operation may be realized to a corresponding extent.

In a low power consumption DDR synchronous type memory device which operates with a low power supply voltage, it is important to reduce current consumption. To this end, in the low power consumption DDR synchronous type memory device, an internal clock should be enabled only for an inevitably necessary period so as to reduce operation current.

That is to say, in a conventional low power consumption DDR synchronous type memory device, an internal clock is enabled only for an appropriate time after a command is applied using the setup time of a chip select signal, and is disabled in the other period to reduce operation current. In this regard, only when the rising and falling edges of a data clock are within the valid window of data, a semiconductor memory device may be precisely inputted with the data. However, as the operation frequency of a memory device gradually increases, a chip select signal is applied with setup and hold times that become gradually shorter.

A semiconductor device includes a data training device for receiving predetermined input data and controlling the setup and hold times thereof. When reading and writing data from and to a semiconductor memory device (for example, a DRAM), data training is performed to control the skew between data.

Such a data training device is provided for each piece of data to be inputted, and performs a function of controlling the setup time and the hold time of each piece of data to be within an appropriate range with respect to a clock. Here, data training refers to an operation of tuning and controlling the setup time and the hold time between data and a clock (a data strobe signal).

Nevertheless, even through a setup time and a hold time are precisely set with respect to each data inputted from a data pin, in the event that a semiconductor device operates at a higher speed or a skew occurs in each data channel, the setup time and the hold time of the data are likely to go out of an appropriate range.

In other words, the rising edge and the falling edge of a data clock may not be within the valid window of data due to a physical delay factor in the course of transmitting the data clock and the data. In this case, a semiconductor memory device may be inputted with erroneous data. In particular, as the valid window (UI) of data gradually decreases and an amount of data increases in a high speed operating system, stable data transfer becomes difficult.

As a consequence, in a high speed operation specification, a method has been used, in which data is latched in the output terminal of a DQ buffer without passing through a circuit for controlling a setup time or a hold time. In such a structure, in the case where DQ data is fast and a DQS (a data strobe signal) is slow, write training is required to align the DQ data with a DQS point.

SUMMARY

A data training device capable of storing various data patterns in a bit line sense amplifier in a write training operation and thereby precisely securing a data window is described herein.

In an embodiment of the present invention, a data training device includes: a training control block configured to activate driving signals for driving a bit line sense amplifier, with a word line deactivated, when a write training operation is performed according to a mode register write command; and the bit line sense amplifier configured to store training data according to the driving signals from the training control block.

In an embodiment of the present invention, a data training device includes: at least one bank electrically coupled to the controller through a data bus, the bank including a bit line sense amplifier and cell array; a training control block configured to activate driving signals for driving the bit line sense amplifier while a word line is deactivated; the bit line sense amplifier configured to store training data according to the driving signals from the training control block, and wherein the cell array is configured to allow data already stored therein to be protected as the word line is deactivated.

In an embodiment of the present invention, a system includes: a processor; a controller configured to receive a request and a data from the processor; and a memory unit configured to receive the request and the data from the controller, wherein the controller includes: a training control block configured to activate driving signals for driving a bit line sense amplifier, with a word line deactivated, when a write training operation is performed according to a mode register write command; and the bit line sense amplifier configured to store training data according to the driving signals from the training control block.

BRIEF DESCRIPTION OF THE DRAWINGS

Features, aspects, and embodiments are described in conjunction with the attached drawings, in which.

DETAILED DESCRIPTION

Hereinafter, a data training device according to the present invention will be described below with reference to the accompanying drawings through various examples of embodiments.

Figure 1:
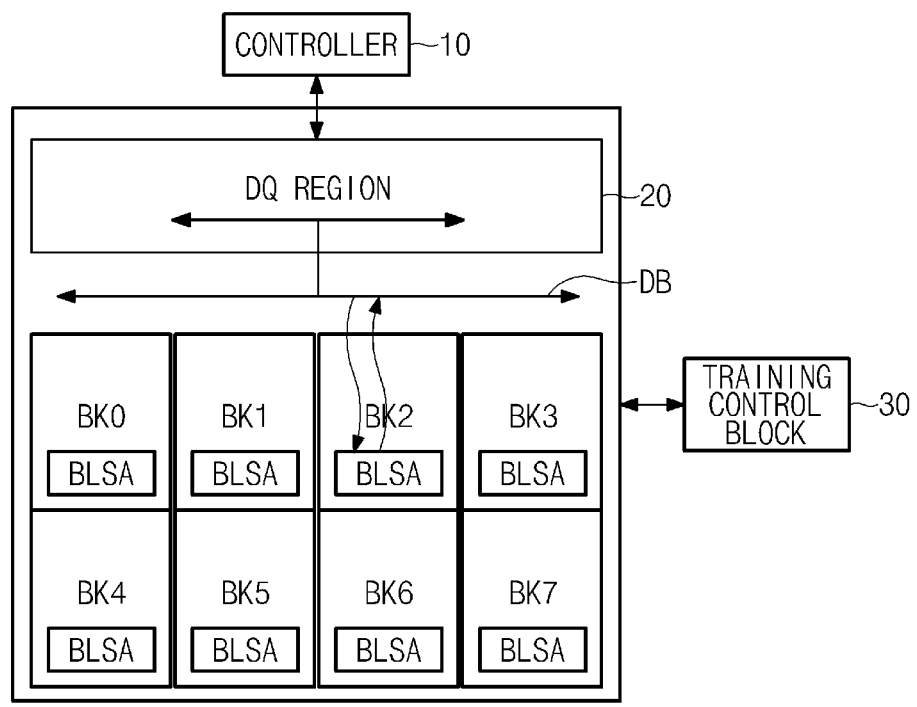
FIG. 1 is a configuration diagram explaining the concept of a data training device in accordance with an embodiment of the present disclosure.

FIG. 1 is a configuration diagram explaining the concept of a data training device in accordance with an embodiment of the present disclosure.

A data training device in accordance with an embodiment of the present disclosure includes a controller 10, a DQ (data) region 20, a plurality of banks BK0 to BK7, and a training control block 30. Each of the banks BK0 to BK7 includes a cell array (which will be described later) for storing data, and a bit line sense amplifier BLSA. While it is described in the embodiment of the present disclosure that 8 banks are exemplified as the plurality of banks BK0 to BK7, it is to be noted that the embodiment of the present disclosure is not limited to such and the number of banks may be sufficiently changed.

First, steps for storing data in bit line sense amplifiers BLSA will be described. The data training device in accordance with the embodiments of the present disclosure receives the data which are applied through the DQ region 20 from the controller 10. The data received through the DQ region 20 are transferred to the banks BK0 to BK7 through a data bus DB. The data transferred to the banks BK0 to BK7 under the control of the training control block 30 are stored in the bit line sense amplifiers BLSA of the banks BK0 to BK7.

Conversely, steps for reading the data stored in the bit line sense amplifiers BLSA will be described. The data stored in the bit line sense amplifiers BLSA of the banks BK0 to BK7 are transferred to the DQ region 20 through the data bus DB. The data transferred to the DQ region 20 are outputted to the external controller 10.

The controller 10 compares the write data initially transmitted to the banks BK0 to BK7 and the read data read from the bit line sense amplifiers BLSA, and performs a data training operation. The controller 10 scans DQ data on the basis of the strobe time of a DQS (a data strobe signal) in a write operation. In other words, an optimal data window is found through a scheme of reading written data and then confirming write data.

Figure 2:
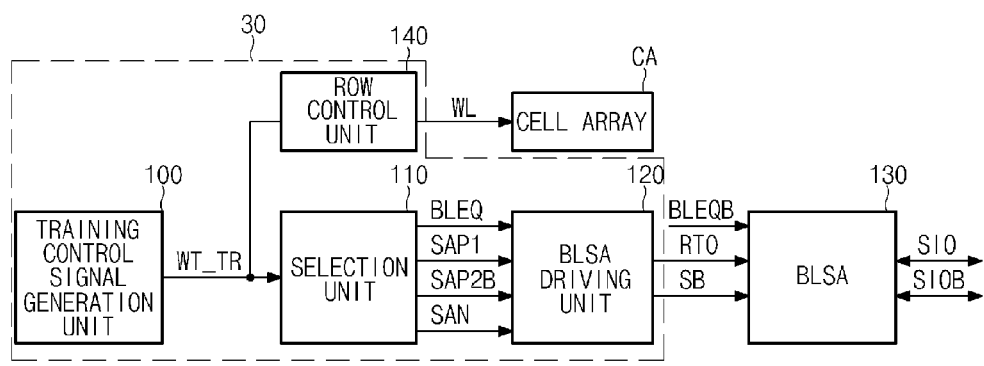
FIG. 2 is a detailed configuration diagram of the training control block of FIG. 1.

FIG. 2 is a detailed configuration diagram of the training control block 30 of FIG. 1.

The training control block 30 includes a training control signal generation unit 100, a selection unit 110, a bit line sense amplifier driving unit 120, and a row control unit 140.

The training control signal generation unit 100 is configured to generate a training control signal WT_TR for performing a training operation. The selection unit 110 is configured to select a bit line sense amplifier 130 of a specified bank (or a mat) and generate sense amplifier control signals. The sense amplifier control signals include a bit line equalizing signal BLEQ, pull-up driving signals SAP1 and SAP2B, and a pull-down driving signal SAN.

The sense amplifier control signals generated by the selection unit 110 are outputted to the bit line sense amplifier driving unit 120. The bit line sense amplifier driving unit 120 is configured to provide driving signals to a pull-up power line RTO and a pull-down power line SB of the bit line sense amplifier 130 according to the sense amplifier control signals. The bit line sense amplifier 130 is configured to store the write data applied from input/output lines SIO and SIOB according to the bit line equalizing signal BLEQB and the driving signals applied from the pull-up power line RTO and the pull-down power line SB.

The row control unit 140 is configured to control whether to activate or deactivate a word line WL, according to the training control signal WT_TR applied from the training control signal generation unit 100. For example, in the case where the training control signal WT_TR is applied in an activated state, the row control unit 140 disables the word line WL to control the word line WL to a deactivated state. Namely, the word line WL is deactivated such that write data are not stored in a cell array CA and write data for training are stored in only the bit line sense amplifier 130.

In order to perform the write training operation, various data patterns are needed. Reading of data becomes possible when such various pieces of data are stored in a block, and to this end, additional data storage is needed. In the embodiments of the present disclosure, training data are stored in the bit line sense amplifier 130 in a block.

Figure 3:
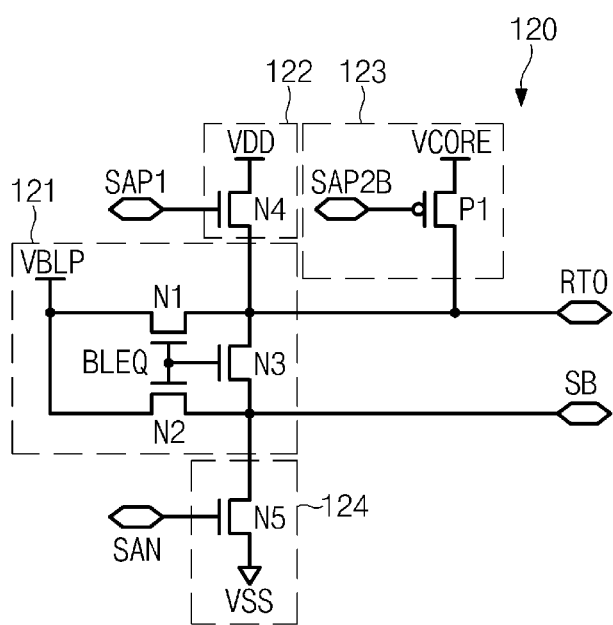
FIG. 3 is a detailed circuit diagram of the bit line sense amplifier driving unit of FIG. 2.

FIG. 3 is a detailed circuit diagram of the bit line sense amplifier driving unit 120 of FIG. 2.

The bit line sense amplifier driving unit 120 includes a precharge driving section 121, pull-up driving sections 122 and 123, and a pull-down driving section 124.

The precharge driving section 121 is configured to provide a precharge voltage VBLP to the pull-up power line RTO and the pull-down power line SB according to the bit line equalizing signal BLEQ in a precharge mode. The precharge driving section 121 includes a plurality of NMOS transistors N1 to N3 of which gate terminals are commonly electrically coupled.

The NMOS transistor N1 is electrically coupled between the application terminal of the precharge voltage VBLP and the pull-up power line RTO, and the NMOS transistor N2 is electrically coupled between the application terminal of the precharge voltage VBLP and the pull-down power line SB. The NMOS transistor N3 is electrically coupled between the pull-up power line RTO and the pull-down power line SB.

The pull-up driving section 122 is configured to provide a power supply voltage VDD as an overdriving voltage to the pull-up power line RTO when the pull-up driving signal SAP1 is activated during an overdriving period. The pull-up driving section 122 includes an NMOS transistor N4. The NMOS transistor N4 is electrically coupled between the application terminal of the power supply voltage VDD and the pull-up power line RTO, and is applied with the pull-up driving signal SAP1 through the gate terminal thereof.

The pull-up driving section 123 is configured to provide a core voltage VCORE to the pull-up power line RTO when the pull-up driving signal SAP2B is activated during an active period. The pull-up driving section 123 includes a PMOS transistor P1. The PMOS transistor P1 is electrically coupled between the application terminal of the core voltage VCORE and the pull-up power line RTO, and is applied with the pull-up driving signal SAP2B through the gate terminal thereof.

The pull-down driving section 124 is configured to provide a ground voltage VSS to the pull-down power line SB when the pull-down driving signal SAN is activated during the active period. The pull-down driving section 124 includes an NMOS transistor N5. The NMOS transistor N5 is electrically coupled between the application terminal of the ground voltage VSS and the pull-down power line SB, and is applied with the pull-down driving signal SAN through the gate terminal thereof.

Operations of the bit line sense amplifier driving unit 120 configured as mentioned above will be described below.

First, during the active period in which the bit line equalizing signal BLEQ is a low level, the respective transistors of the precharge driving section 121 are turned off. According to this fact, the precharge voltage VBLP is not provided to the pull-up power line RTO and the pull-down power line SB.

After an active command is applied, the word line WL is activated, and entry is made to the overdriving period when a bit line pair BL and BLB develops. During the overdriving period, the pull-up driving signal SAP1 and the pull-up driving signal SAP2B have high levels, and the pull-down driving signal SAN has a low level.

That is to say, in the case where the pull-up driving signal SAP1 is the high level, the NMOS transistor N4 of the pull-up driving section 122 is turned on. Accordingly, the pull-up power line RTO is overdriven to the level of the power supply voltage VDD.

During the overdriving period, since the pull-up driving signal SAP2B has the high level and the pull-down driving signal SAN has the low level, the pull-up driving section 123 and the pull-down driving section 124 retain turned-off states.

During an active operation period after the overdriving period, the pull-up driving signal SAP1 transitions to a low level, and the pull-up driving section 122 is turned off. Further, as the pull-up driving signal SAP2B transitions to a low level, the pull-up driving section 123 is turned on. According to this fact, during the active operation period, the pull-up power line RTO is driven to the level of the core voltage VCORE. In this way, while the voltage level of the pull-up power line RTO rises during the overdriving period, it falls to the level of the core voltage VCORE after the overdriving period.

Thereafter, the word line WL is activated until the bit line equalizing signal BLEQ transitions to a high level. If the bit line equalizing signal BLEQ transitions to the high level, entry is made to a precharge period and the word line WL is disabled.

Figure 4:
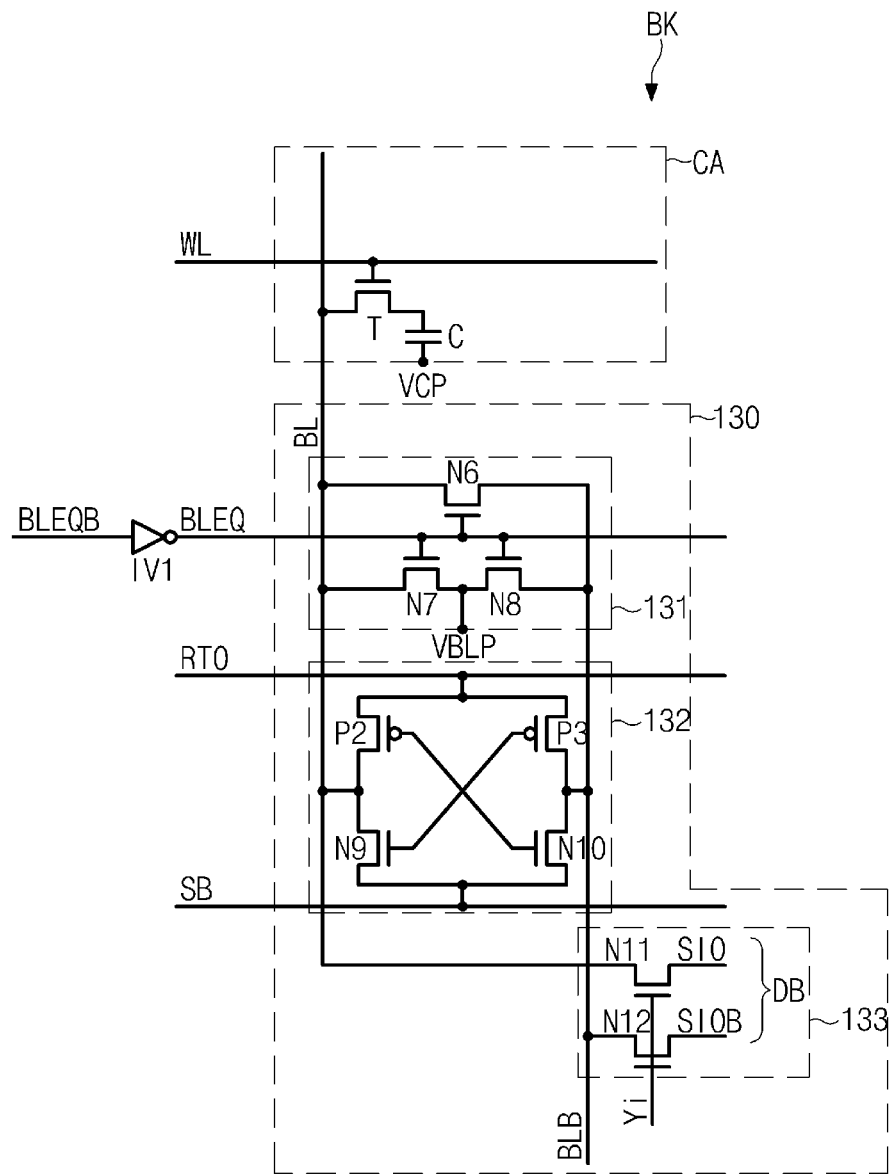
FIG. 4 is a detailed circuit diagram of the bit line sense amplifier of FIG. 2.

FIG. 4 is a detailed circuit diagram of the cell array CA and the bit line sense amplifier 130 of FIG. 2.

Each bank BK (i.e., BK0 to BK7 of FIG. 1) includes the cell array CA and the bit line sense amplifier 130. The cell array CA stores the data applied from the bit lines BL and BLB or outputs stored data to the bit line sense amplifier 130 through the bit lines BL and BLB, when the word line WL is activated.

The unit cell of the cell array CA includes one switching element T and one capacitor C. The switching element T is electrically coupled between the bit line BL and the capacitor C and selectively performs a switching operation according to the word line WL. The capacitor C is electrically coupled between the application terminal of a cell plate voltage VCP and the switching element T and stores data. If the word line WL is activated, the switching element T is turned on, and the data applied from the bit line BL is stored in the capacitor C.

The bit line sense amplifier 130 includes a precharge section 131, a storage section 132, and a column selecting section 133.

The precharge section 131 includes a plurality of NMOS transistors N6 to N8 of which gate terminals are commonly electrically coupled. The NMOS transistor N6 is electrically coupled between the bit line pair BL and BLB. The NMOS transistors N7 and N8 are electrically coupled in series between the bit line pair BL and BLB and are applied with the precharge voltage VBLP through the common drain terminal thereof.

The plurality of NMOS transistors N6 to N8 are applied with a bit line equalizing signal BLEQ through the common gate terminal thereof. The bit line equalizing signal BLEQ is a signal which is generated as the bit line equalizing signal BLEQB is inverted by an inverter IV1, and has a phase opposite to that of the bit line equalizing signal BLEQB.

In the precharge section 131, in the case where the bit line equalizing signal BLEQ is a high level, all of the NMOS transistors N6 to N8 are turned on, and the bit line pair BL and BLB is precharged to the level of the precharge voltage VBLP. Conversely, in the case where the bit line equalizing signal BLEQ is a low level, all of the NMOS transistors N6 to N8 are turned off.

The storage section 132 includes PMOS transistors P2 and P3, and NMOS transistors N9 and N10. The gate terminals of the PMOS transistors P2 and P3 and NMOS transistors N9 and N10 are cross-coupled.

The PMOS transistor P2 and the NMOS transistor N9 are electrically coupled in series between the pull-up power line RTO and the pull-down power line SB. The common drain terminal of the PMOS transistor P2 and the NMOS transistor N9 is electrically coupled with the bit line BL. The PMOS transistor P3 and the NMOS transistor N10 are electrically coupled in series between the pull-up power line RTO and the pull-down power line SB. The common drain terminal of the PMOS transistor P3 and the NMOS transistor N10 is electrically coupled with the bit line BLB.

According to this fact, the storage section 132 stores data in the PMOS transistors P2 and P3 and the NMOS transistors N9 and N10 with a latch structure, according to the driving signals applied from the pull-up power line RTO and the pull-down power line SB.

The column selecting section 133 includes NMOS transistors N11 and N12. The NMOS transistor N11 is electrically coupled between the bit line BL and the input/output line SIO and is applied with a column select signal Yi through the gate terminal thereof. The NMOS transistor N12 is electrically coupled between the bit line BLB and the input/output line SIOB and is applied with the column select signal Yi through the gate terminal thereof.

Accordingly, in the column selecting section 133, in the case where the column select signal Yi is a high level, the NMOS transistors N11 and N12 are turned on. In this case, the read data applied from the bit line pair BL and BLB are transferred to the input/output lines SIO and SIOB, or the write data applied from the input/output lines SIO and SIOB are stored in the storage section 132.

The input/output lines SIO and SIOB may correspond to the data bus DB shown in FIG. 1. In the write training operation, the write data applied from the input/output lines SIO and SIOB are stored in the bit line sense amplifier 130.

At this time, since the word line WL is deactivated (disabled) by the row control unit 140, the data stored in the bit line sense amplifier 130 are not transferred to the cell array CA. According to this fact, the data stored in the cell array CA may be protected. Also, since the bit line equalizing signal BLEQ is deactivated (to the low level) by the selection unit 110, the bit line pair BL and BLB is not precharged.

Figure 5:
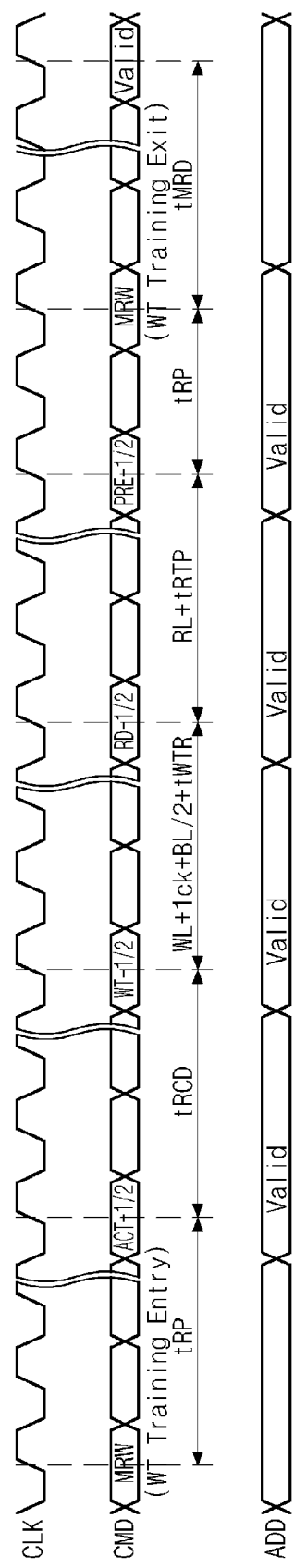
FIG. 5 is an operation timing diagram of the data training device in accordance with the embodiment of the present disclosure.

The operation procedure of the data training device in accordance with the embodiments of the present disclosure, having the configuration as mentioned above, will be described below with reference to the operation timing diagram of FIG. 5.

First, the training control signal generation unit 100 activates and outputs the training control signal WT_TR for performing a training operation under a data training mode. If the training control signal WT_TR is activated, the selection unit 110 selects the bit line sense amplifier 130 of a specified bank (or a mat), and outputs the bit line equalizing signal BLEQ, the pull-up driving signals SAP1 and SAP2B, and the pull-down driving signal SAN.

Thereafter, the sense amplifier control signals generated by the selection unit 110 are outputted to the bit line sense amplifier driving unit 120. The bit line sense amplifier driving unit 120 provides the driving signals to the pull-up power line RTO and the pull-down power line SB of the bit line sense amplifier 130 according to the sense amplifier control signals. In other words, the bit line sense amplifier driving unit 120 drives the pull-up power line RTO and the pull-down power line SB, and performs a control task such that data are stored in the storage section 132.

Then, the bit line sense amplifier 130 stores the write data applied from the input/output lines SIO and SIOB, according to the bit line equalizing signal BLEQB and the driving signals applied from the pull-up power line RTO and the pull-down power line SB.

In the case where the training control signal WT_TR is applied in the activated state, the row control unit 140 disables the word line WL to control the word line WL to the deactivated state. Namely, by deactivating the word line WL, write data are not stored in the cell array CA, and write data for training are stored in only the bit line sense amplifier 130.

Meanwhile, in each data input/output pin of a DDR synchronous type memory device, two data are consecutively inputted and outputted in synchronization with the rising edge and the falling edge of a clock which is inputted from an outside. Accordingly, since it is possible to achieve a bandwidth at least two times broader than a conventional SDR synchronous type memory device without increasing the frequency of a clock, a high speed operation may be realized to a corresponding extent.

In the specification of a DDR synchronous type memory device suggested by JEDEC (Joint Electron Device Engineering Council), it is prescribed that testing be performed by entering a test mode through receiving a mode register write (MRW) command to test whether a DDR memory device operates normally.

Recently, with the development of technologies, semiconductor memory devices continuously trend toward high degree of integration and high speed operation, and are used by being mounted to various products from large-sized electronic home appliances to small-sized mobile appliances. According to this fact, semiconductor memory devices are being produced in large quantities, and in order to decrease a failure rate, various kinds of tests are being performed.

In general, after a wafer manufacturing process is completed, the performance of a semiconductor memory device is tested at a step before packaging. In this regard, setting is made such that a semiconductor memory device enters a test mode when specified command and address are inputted.

In particular, a high performance semiconductor memory device such as an LPDDR4 specification enters a test mode when a specified address signal is inputted at a high level and a mode register write command is inputted.

The training control signal generation unit 100 in accordance with the embodiments of the present disclosure determines entry to a write training mode and recognizes the write training mode when a mode register write command MRW is activated. The mode register write command MRW is inputted in synchronization with a clock CLK.

That is to say, the training control signal generation unit 100 provides a mode register write command operation in which the information of the mode set in a register is inputted. In the embodiments of the present disclosure, write training entering and exiting operations are distinguished according to the mode register write command MRW.

When a time tRP (a RAS precharge time) has passed after the mode register write command MRW is applied, the training control signal generation unit 100 activates and outputs the training control signal WT_TR according to an active command ACT. The write data applied from the time when the training control signal WT_TR is activated are recognized as valid data.

Then, when a time tRCD (a RAS to CAS delay) has passed after the active command ACT is applied (i.e., ACT+½), a write command WT is applied (i.e., WT−½). If the write command WT is applied, the controller 10 transfers write data to the DQ region 10. The write data applied to the DQ region 10 are transferred to the bit line sense amplifier 130 of the bank BK through the data bus DB and are stored therein.

The bit line sense amplifier 130 of the block BK selected by the selection unit 110 may be driven by the bit line sense amplifier driving unit 120 and may store the write data applied through the data bus DB. Further, if the training control signal WT_TR is activated, the word line WL is disabled by the row control unit 140. According to this fact, in the state in which write data are not additionally stored in the cell array CA, write data for the write training operation are stored in only the storage section 132 of the bit line sense amplifier 130 (i.e., WL+1ck+BL/2+tWTR).

Next, if a read command RD is applied (i.e., RD−½), the read data latched by the bit line sense amplifier 130 are outputted to the data bus DB. A read operation is performed for a time tWTR (a write to read time) after the read command RD is applied.

When a time tRTP (a read to precharge time) has passed after the read operation is performed, a precharge command PRE is applied. The time tRTP is prescribed in the specification of JEDEC, and the value thereof is stored in a mode register set (MRS). Auto precharge is performed in response to a precharge signal which is activated by a precharge signal generation circuit at the time when the time tRTP has passed after the read command RD is applied (i.e., RL+tRTP).

If the precharge command PRE is applied (i.e., PRE−½), the bit line equalizing signal BLEQ is activated to the high level, and the bit line sense amplifier 130 is precharged to the level of the precharge voltage VBLP. In the case where the specified bank BK is selected to perform the write training operation, only the selected bank BK is precharged. In other words, in order to store another data pattern in the bit line sense amplifier 130 after the read operation, data are written again after performing a precharge operation (i.e., tRP).

Afterwards, if the mode register write command MRW is applied again, the training control signal generation unit 100 deactivates the training control signal WT_TR to exit the write training mode. Setting may be made such that a mode register write operation is completed during a time tMRD (a mode register set command cycle time).

As is apparent from the above descriptions, according to the embodiments of the present disclosure, since various data patterns are stored in a bit line sense amplifier during a write training operation, it is possible to precisely secure a data window.

Also, according to the embodiment of the present disclosure, since it is not necessary to prepare an additional data storage to perform a write training operation in a product operating at a high speed, it is possible to reduce the size of the product.

Figure 6:
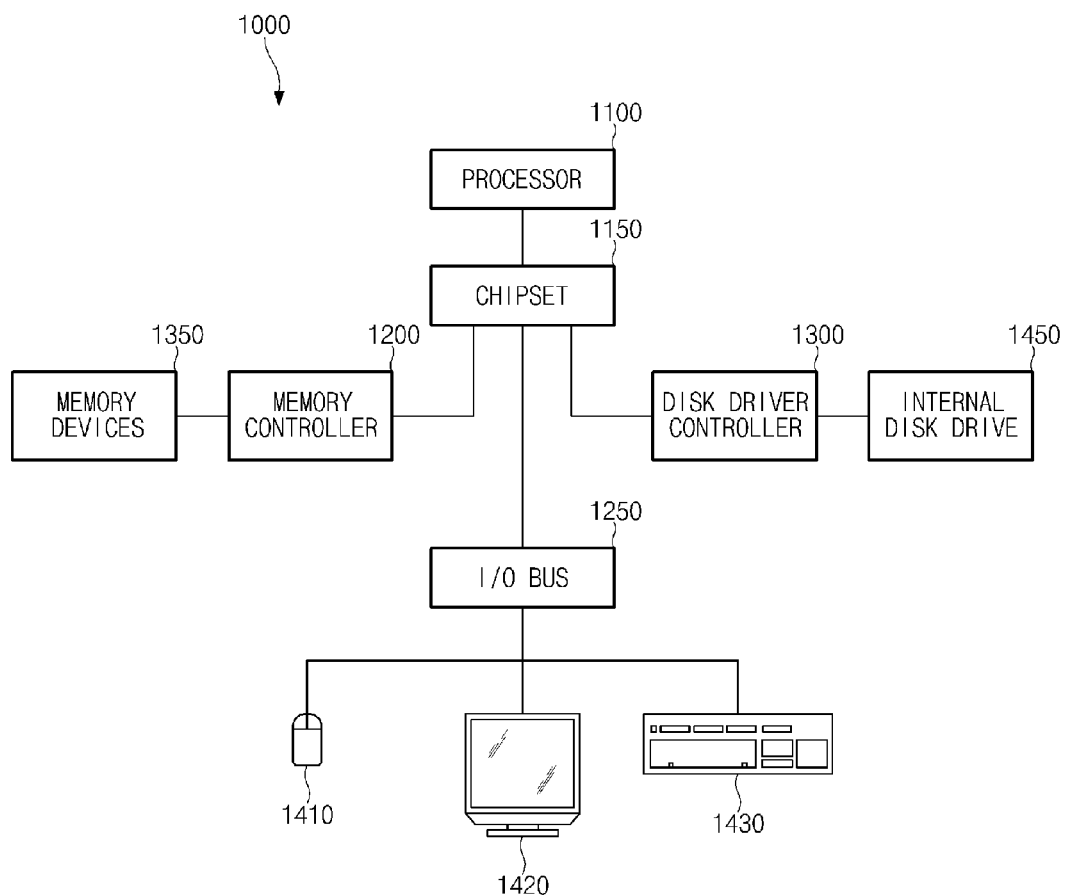
FIG. 6 illustrates a block diagram of a system employing a data training device in accordance with embodiments of the present invention.

The data training device discussed above are particular useful in the design of memory devices, processors, and computer systems. For example, referring to FIG. 6, a block diagram of a system employing a memory controller in accordance with embodiments of the invention is illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one data training device including: a training control block configured to activate driving signals for driving a bit line sense amplifier, with a word line deactivated, when a write training operation is performed according to a mode register write command; and the bit line sense amplifier configured to store training data according to the driving signals from the training control block. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may corresponded and include the data training devices discussed above with regards to FIGS. 1-5, the data training device may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 6 is merely one example of a system employing a memory controller having a data training device as described above with reference to FIGS. 1-5. In alternate embodiments, such as cellular phones or digital cameras, the components may differ from the embodiments shown in FIG. 6.

While certain embodiments have been described above, it will be understood to those skilled in the art that the embodiments described are by way of example only. Accordingly, the data training device described herein should not be limited based on the described embodiments. Rather, the data training device described herein should only be limited in light of the claims that follow when taken in conjunction with the above description and accompanying drawings.

Hereinbefore, detailed descriptions were given according to the embodiments of the present disclosure. For reference, embodiments including additional component elements may be exemplified to describe the present disclosure in further detail although the component elements are not directly associated with the technical concept of the present disclosure. Also, configurations including the terms such as enable, disable, high and low for indicating activated and deactivated states of signals and circuits may be changed according to an embodiment. Further, the configurations of transistors may be changed as the occasion demands to realize the same functions. That is to say, the configurations of a PMOS transistor and an NMOS transistor may be replaced with each other, and may be realized using various transistors, if so desired. Since such circuit changes have a large number of cases and may be easily inferred by a person having ordinary knowledge in the art, enumeration thereof will be omitted herein.

What is claimed is:

1. A data training device comprising:
    a training control block configured to activate driving signals for driving a bit line sense amplifier, with a word line deactivated, when a write training operation is performed according to a mode register write command;
    the bit line sense amplifier configured to store training data according to the driving signals from the training control block; and
    a cell array configured to allow data already stored therein to be protected as the word line is deactivated in the write training operation.

2. The data training device according to claim 1, wherein the training control block comprises:
    a training control signal generation unit configured to activate and output a training control signal when the write training operation is performed;
    a selection unit configured to select a corresponding bank and output sense amplifier control signals, according to the training control signal; and a bit line sense amplifier driving unit configured to drive the sense amplifier control signals and provide the sense amplifier control signals to power lines of the bit line sense amplifier.

3. The data training device according to claim 2, wherein the bit line sense amplifier driving unit comprises:
 a precharge driving section configured to precharge the power lines of the bit line sense amplifier according to a bit line equalizing signal;
 a first pull-up driving section configured to pull-up drive a pull-up power line during an overdriving period, according to a first pull-up driving signal;
 a second pull-up driving section configured to pull-up drive the pull-up power line during an active period, according to a second pull-up driving signal; and
 a pull-down driving section configured to pull-down drive a pull-down power line during the active period, according to a pull-down driving signal.

4. The data training device according to claim 1, wherein the training control block further comprises:
 a row control unit configured to deactivate the word line when the write training operation is performed.

5. The data training device according to claim 1, further comprising:
 a controller configured to transfer the training data to the bit line sense amplifier.

6. The data training device according to claim 5, wherein the controller performs a data training operation by comparing write data transmitted to the bit line sense amplifier and read data read from the bit line sense amplifier.

7. The data training device according to claim 5, further comprising:
 a data bus configured to transfer the training data applied from the controller, to the bit line sense amplifier.

8. The data training device according to claim 1, further comprising:
 a data region configured to be inputted with and output the training data.

9. The data training device according to claim 1, wherein the bit line sense amplifier comprises:
 a precharge section configured to precharge a bit line pair according to the bit line equalizing signal;
 a storage section configured to store data applied from the bit line pair according to the driving signals; and
 a column selecting section configured to transfer the training data to the bit line pair according to a column select signal.

10. The data training device according to claim 1, wherein the training control block determines whether to enter or exit the write training operation, according to the mode register write command.

11. The data training device according to claim 1, wherein the training control block activates and outputs the training control signal according to an active command which is applied after the mode register write command is applied.

12. The data training device according to claim 11, wherein write data applied from a time when the training control signal is activated are recognized as valid data.

13. The data training device according to claim 11, wherein, when a write command applied after the active command is activated, write data are applied to the bit line sense amplifier.

14. The data training device according to claim 13, wherein data stored in the bit line sense amplifier are read according to a read command applied after the write command.

15. The data training device according to claim 14, wherein the bit line sense amplifier is precharged after the read command.

16. A data training device comprising:
 at least one bank electrically coupled to the controller through a data bus, the bank including a bit line sense amplifier and cell array;
 a training control block configured to activate driving signals for driving the bit line sense amplifier while a word line is deactivated, when a write training operation is performed according to a mode register write command;
 the bit line sense amplifier configured to store training data according to the driving signals from the training control block, and
 wherein the cell array is configured to allow data already stored therein to be protected as the word line is deactivated in the write training operation.

17. The data training device according to claim 16, wherein the training control block comprises:
 a training control signal generation unit configured to activate and output a training control signal when the write training operation is performed;
 a selection unit configured to select a corresponding bank and output sense amplifier control signals, according to the training control signal; and
 a bit line sense amplifier driving unit configured to drive the sense amplifier control signals and provide the sense amplifier control signals to power lines of the bit line sense amplifier.

18. A system comprising:
 a processor;
 a controller configured to receive a request and a data from the processor; and
 a memory unit configured to receive the request and the data from the controller,
 wherein the controller includes:
 a training control block configured to activate driving signals for driving a bit line sense amplifier, with a word line deactivated, when a write training operation is performed according to a mode register write command; and
 the bit line sense amplifier configured to store training data according to the driving signals from the training control block; and
 a cell array configured to allow data already stored therein to be protected as the word line is deactivated in the write training operation.

19. The data training device according to claim 18, wherein the training control block comprises:
 a training control signal generation unit configured to activate and output a training control signal when the write training operation is performed;
 a selection unit configured to select a corresponding bank and output sense amplifier control signals, according to the training control signal; and
 a bit line sense amplifier driving unit configured to drive the sense amplifier control signals and provide the sense amplifier control signals to power lines of the bit line sense amplifier.

* * * * *